United States Patent
Ge et al.

(10) Patent No.: US 10,249,356 B2
(45) Date of Patent: Apr. 2, 2019

(54) MEMCAPACITIVE CROSS-BAR ARRAY FOR DETERMINING A DOT PRODUCT

(71) Applicant: Hewlett Packard Enterprise Development LP, Houston, TX (US)

(72) Inventors: Ning Ge, Palo Alto, CA (US); John Paul Strachan, San Carlos, CA (US); Jianhua Yang, Palo Alto, CA (US); Miao Hu, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 28 days.

(21) Appl. No.: 15/522,344

(22) PCT Filed: Oct. 28, 2014

(86) PCT No.: PCT/US2014/062694
§ 371 (c)(1),
(2) Date: Apr. 27, 2017

(87) PCT Pub. No.: WO2016/068886
PCT Pub. Date: May 6, 2016

(65) Prior Publication Data
US 2017/0323677 A1  Nov. 9, 2017

(51) Int. Cl.
*G11C 11/24* (2006.01)
*G11C 11/34* (2006.01)
*G06G 7/16* (2006.01)

(52) U.S. Cl.
CPC ............... *G11C 11/24* (2013.01); *G06G 7/16* (2013.01); *G11C 11/34* (2013.01)

(58) Field of Classification Search
CPC ......................................................... G06F 7/16
USPC ......................................................... 708/603
See application file for complete search history.

(56) References Cited

U.S. PATENT DOCUMENTS

| | | |
|---|---|---|
| 7,392,429 B2 | 6/2008 | Frank et al. |
| 7,490,252 B2 | 2/2009 | Tsai et al. |
| 8,453,000 B2 | 5/2013 | Ben et al. |
| 8,674,823 B1 | 3/2014 | Contario et al. |
| 9,330,738 B2* | 5/2016 | Taylor, Jr. ................. G11C 7/16 |
| 2011/0051310 A1 | 3/2011 | Strachan et al. |
| 2012/0014170 A1 | 1/2012 | Strukov et al. |
| 2012/0039114 A1 | 2/2012 | Bratkovski et al. |
| 2012/0146184 A1 | 6/2012 | Pickett et al. |
| 2013/0028004 A1 | 1/2013 | Snider |

OTHER PUBLICATIONS

Gao et al, Analog-Input Analog-Weight Dot-Product Operation with Ag/a-Si/Pt Memristive Deives, pp. 1-6 (undated).*

(Continued)

*Primary Examiner* — Tan V Mai
(74) *Attorney, Agent, or Firm* — Hewlett Packard Enterprise Patent Department

(57) ABSTRACT

A method of obtaining a dot product includes applying a programming signal to a number of capacitive memory devices coupled at a number of junctions formed between a number of row lines and a number of column lines. The programming signal defines a number of values within a matrix. The method further includes applying a vector signal. The vector signal defines a number of vector values to be applied to the capacitive memory devices.

15 Claims, 4 Drawing Sheets

(56) References Cited

OTHER PUBLICATIONS

Crump, G. et al., Power Failure and Flash Storage [online], Storage Switzerland, LLC, 2013, Retrieved from the Internet < http://www.skyera.com/wp-content/uploads/2013/04/Power-Failure-and-Flash-Storage-Handout.pdf > [retrieved on Sep. 26, 2014], 3 pages.
International Searching Authority, The International Search Report and the Written Opinion, PCT/US2014/062694, dated Jun. 30, 2015, 11 Pages.

* cited by examiner

MEMCAPACITIVE CROSS-BAR ARRAY FOR DETERMINING A DOT PRODUCT

BACKGROUND

Capacitive memory elements, often referred to as memcapacitors, are devices that may be programmed to different capacitive states by applying electrical voltage or currents to the memcapacitors. After programming the state of the memcapacitors, the memcapacitors may be read. The state of the memcapacitors remains stable over a specified time period. A number of memcapacitors may be included within a crossbar array in which a number of column lines intersect with a number of row lines at junctions, and the memcapacitors are coupled to the column lines and row lines at the junctions.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
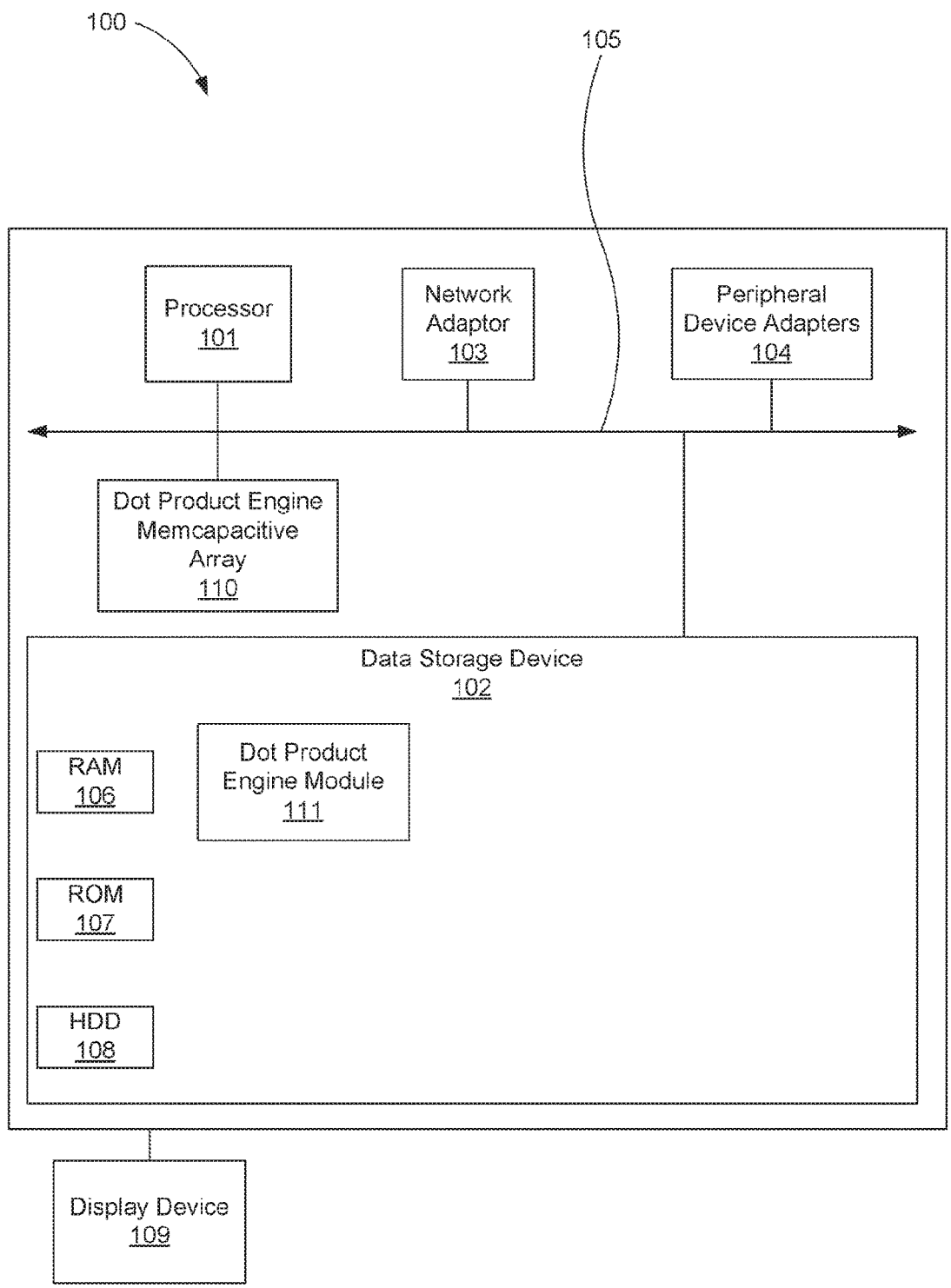
FIG. 1 is a diagram of a computing system for determining a dot product, according to one example of the principles described herein.

Crossbar arrays of memcapacitors may be used in a variety of applications, including non-volatile solid state memory, programmable logic, signal processing, control systems, pattern recognition, and other applications. The present application is directed to a memcapacitive cross-bar array for determining a dot product. The memcapacitive cross-bar array includes a number of row lines, a number of column lines intersecting the row lines to form a number of junctions, and a number of capacitive memory devices coupled between the row lines and the column lines at the junctions. The capacitive memory devices referred to herein as memcapacitors receive a number of ground signals. The ground signals clear all charges from the capacitive memory devices. The memcapacitors also receive a number of programming signals. The programming signals define a number of values within a matrix. The memcapacitors also receive a number of vector signals. The vector signals define a number of vector values to be applied to the memcapacitors. The memcapacitive cross-bar array also includes a charge collection line to collect all charges output from the memcapacitors through their respective column lines. The collected charge equals a dot product of the matrix values and vector values.

The present application is directed to a dot product engine (DPE) that utilizes memcapacitors in a cross-bar array and charge evaluation to determine a dot product of a number of matrix values and a number of vector values. The DPE performs a dot product evaluation with relatively little power consumption compared to other devices, and eliminates sneak path leakage within the system. The DPE has a flexible output measurement resolution that is dependent on integration of current over time.

As used in the present specification and in the appended claims, the term "dot product" is meant to be understood broadly as the product of two vectors to form a scalar, whose value is the product of the magnitudes of the vectors and the cosine of the angle between them. In one example, the vectors may be represented as matrices that may be multiplied to obtain the dot product. Other conventional names for dot product include scalar product and inner product.

Further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

FIG. 1 is a diagram of a computing system (100) for determining a dot product, according to one example of the principles described herein. The computing system (100) may be implemented in an electronic device. Examples of electronic devices include servers, desktop computers, laptop computers, personal digital assistants (PDAs), mobile devices, smartphones, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. In one example, the methods provided by the computing system (100) are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) includes various hardware components. Among these hardware components may be a number of processors (101), a number of data storage devices (102), a number of peripheral device adapters (103), and a number of network adapters (104). These hardware components may be interconnected through the use of a number of busses and/or network connections. In one example, the processor (101), data storage device (102), peripheral device adapters (103), and a network adapter (104) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of applying a number of first voltages to a corresponding number of row lines within a memcapacitive cross-bar array to change the capacitive values of a corresponding number of memcapacitors located at junctions between the row lines and a number of column lines, the first voltages representing a corresponding number of values within a matrix, respectively. The executable code may, when executed by the processor (101), also cause the processor (101) to implement at least the functionality of applying a number of second voltages to a corresponding number of row lines within a memcapacitive cross-bar array, the second voltages representing a corresponding number of vector values. The executable code may, when executed by the processor (101), further cause the processor (101) to implement at least the functionality of collecting the output currents from the column lines, the collected output currents representing the dot product. The functionality of the computing system (100) is in accordance to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

The data storage device (102) may include a computer readable medium, a computer readable storage medium, or a non-transitory computer readable medium, among others. For example, the data storage device (102) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, display device (109), a mouse, or a keyboard. The peripheral device adapters (103) may also provide access to other external devices such as an external storage device, a number of network devices such as, for example, servers, switches, and routers, client devices, other types of computing devices, and combinations thereof.

The display device (109) may be provided to allow a user of the computing system (100) to interact with and implement the functionality of the computing system (100). The peripheral device adapters (103) may also create an interface between the processor (101) and the display device (109), a printer, or other media output devices. The network adapter (104) may provide an interface to other computing devices within, for example, a network, thereby enabling the transmission of data between the computing system (100) and other devices located within the network.

The computing system (100) may, when executed by the processor (101), display the number of graphical user interfaces (GUIs) on the display device (109) associated with the executable program code representing the number of applications stored on the data storage device (102). The GUIs may display, for example, interactive screenshots that allow a user to interact with the computing system (100) to input matrix and vector values in association with a dot product engine (DPE) memcapacitive array (110) as will be described in more detail below. Additionally, via making a number of interactive gestures on the GUIs of the display device (109), a user may obtain a dot product value based on the input data. Examples of display devices (109) include a computer screen, a laptop screen, a mobile device screen, a personal digital assistant (PDA) screen, and a tablet screen, among other display devices (106). Although the DPE memcapacitive array (110) is depicted as being a device internal to the computing system (100), in another example, the DPE memcapacitive array (110) may be a peripheral device coupled to the computing system (100) or included within a peripheral device coupled to the computing system (100).

The computing system (100) may further include a dot product engine (DPE) memcapacitive array (110). As will be described in more detail below, the DPE memcapacitive array (110) includes a number of elements including a number of memcapacitors that function together within an array to perform a weighted sum of multiple inputs. The DPE memcapacitive array (110) may be used in a number of applications. For example, the DPE memcapacitive array (110) may be used as a threshold logic gate (TLG) to perform a matrix product to compare the output with a threshold. Thus, the DPE memcapacitive array (110) may be used as an accelerator in which the DPE memcapacitive array (110) performs a number of functions faster than is possible in software running on a more general-purpose processing device. Although the DPE memcapacitive array (110) is depicted as being a device internal to the computing system (100), in another example, the DPE memcapacitive array (110) may be a peripheral device coupled to the computing system (100) or included within a peripheral device coupled to the computing system (100).

The computing system (100) further includes a number of modules used in the implementation of the systems and methods described herein. The various modules within the computing system (100) includes executable program code that may be executed separately. In this example, the various modules may be stored as separate computer program products. In another example, the various modules within the computing system (100) may be combined within a number of computer program products; each computer program product including a number of the modules.

The computing system (100) may include a dot product engine module (111) to, when executed by the processor (101), assist in the functionality of the DPE memcapacitive array (110). The dot product engine module (111), for example, receives a number of input values defining a matrix to be processed in a dot product mathematical calculation. The dot product engine module (111) may send the input values to the DPE memcapacitive array (110) as programming signals to a number of memcapacitors within the DPE memcapacitive array (110) to program the memcapacitors. The dot product engine module (111) may also receive a vector input to be processed in connection with the matrix programmed into the memcapacitors. The dot product engine module (111) may further obtain a value representing the dot product, and convey that value as data to the computing system (100) or another computing device for analysis or further processing.

Figure 2:
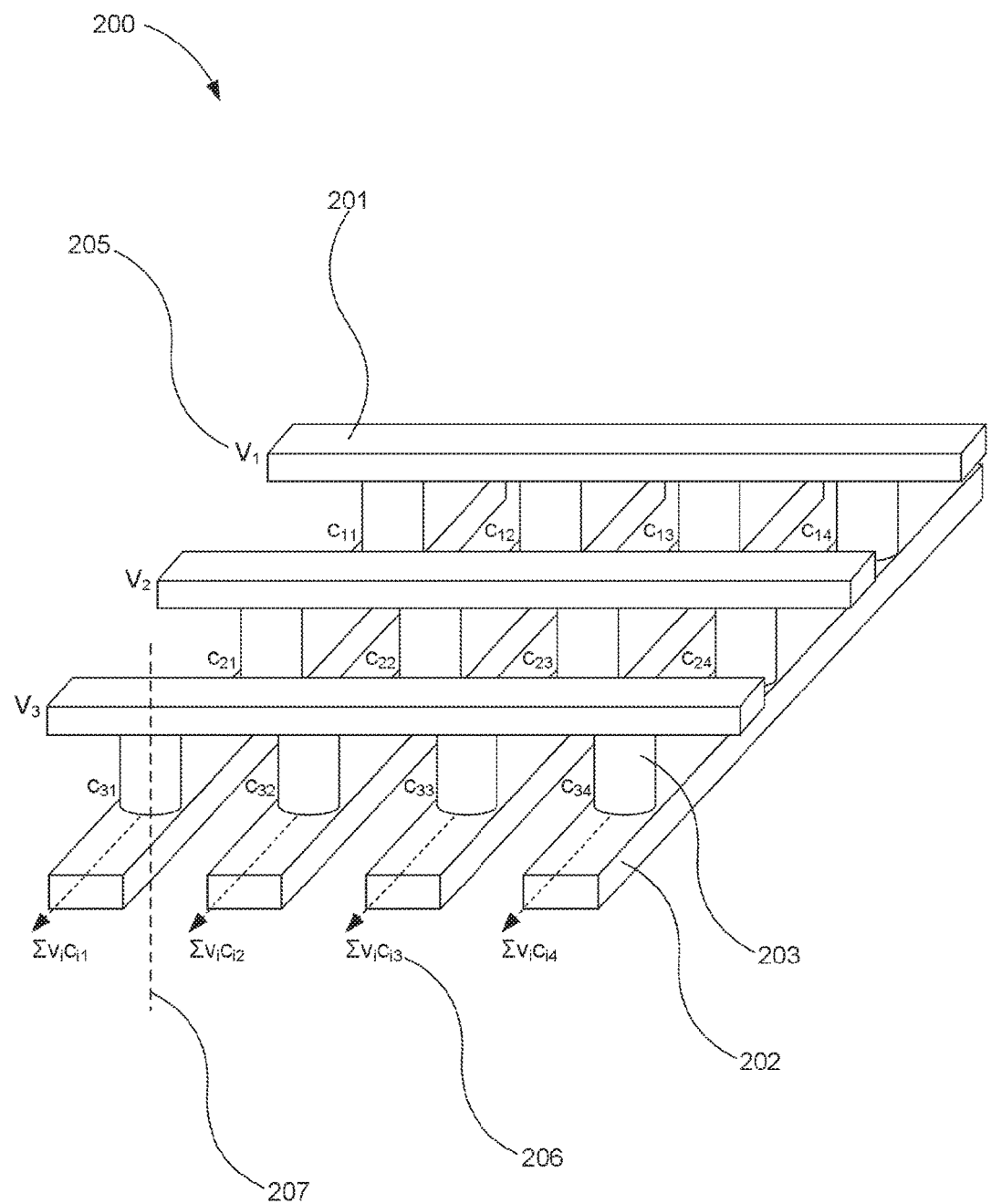
FIG. 2 is a diagram of a memcapacitive cross-bar array used within the dot product engine (DPE) memcapacitive array of the computing system of FIG. 1, according to one example of the principles described herein.

FIG. 2 is a diagram of a memcapacitive cross-bar array (200) used within the dot product engine (DPE) memcapacitive array (110) of the computing system (100) of FIG. 1, according to one example of the principles described herein. The memcapacitive cross-bar array (200) may include a number of electrically conductive row lines (201) and a number of electrically conductive column lines (202). Even though three row lines (201) and four column lines (202) are depicted in FIG. 2, any number of row lines (201) and column lines (202) may be present in the memcapacitive cross-bar array (200). The row lines (201) and column lines (202) intersect at junctions as indicated by the dashed line (207). A number of capacitive memory devices or "memcapacitors" (203) are located at the junctions (207) and electrically couple the row lines (201) to the column lines (202).

Memcapacitance is a property of the electronic component referred to as a memcapacitor. If charge flows in one direction through a circuit, the capacitance of the memcapacitor within the circuit will increase. If charge flows in the opposite direction in the circuit, the capacitance of the memcapacitor will decrease. If the flow of charge is stopped by turning off the applied voltage, the memcapacitor will "remember" the last capacitance that it had, and when the flow of charge starts again the capacitance of the circuit will be what it was when it was last active. A memcapacitor is a capacitor device whose capacitance can be changed. The charge, Q, stored in a capacitor may be represented by the following relationship:

$$Q = C * V \qquad \text{Eq. 1}$$

where C is the capacitor's capacitance, and V is the voltage applied to capacitor. A memcapacitor has similar relationship except the capacitance is memorable and has multiple states available.

The conductance channels in the memcapacitors (203) may be formed in each of the memcapacitors (203) and the memcapacitors (203) may be individually addressed as bits. A cross-bar is an array of switches that connect each wire in one set of parallel wires (201) to every member of a second set of parallel wires (202) that intersects the first set (201). In the example of FIG. 2, the row lines (201) and the column lines (202) are perpendicular with respect to each other, but the row lines (201) and the column lines (202) may intersect at any angle.

The memcapacitors (203) may be built at the micro- or nano-scale and used as a component in a wide variety of electronic circuits, such as, bases for memories and logic circuits. When used as a basis for memories, the memcapacitors (203) may be used to store a bit of information, 1 or 0. When used as a logic circuit, as described herein, the memcapacitors (203) may be employed to represent bits in a field programmable gate array, as the basis for a wired-logic programmable logic array, or, as described herein, as a dot product engine. The memcapacitors (203) disclosed herein may also to find uses in a wide variety of other applications. The memcapacitors (203) may be fabricated through any reasonably suitable fabrication process, such as, for example, chemical vapor deposition, sputtering, etching, lithography, or other methods of forming memcapacitors.

The memcapacitive cross-bar array (200) of FIG. 2 further includes a number of input values (205) indicated as $V_1$, $V_2$, and $V_3$. The input values (205) may be program signals used to change the capacitance values at each individual memcapacitor (203) at each junction in the cross-bar array to create a representation (e.g., a mapping) of a mathematic matrix in which each value at each junction represents a value within the matrix. This change in capacitance among the individual memcapacitors (203) is an analog change from a low-to-high value or a high-to-low value. In this manner, the memcapacitors are "memory capacitors" in that they "remember" the last capacitance that they had.

The input values (205) may also be read signals used to read the capacitance values at each individual memcapacitor (203) at each junction in the cross-bar array, and, as will now be described, as a way to multiply a matrix value by a vector value at each memcapacitor (203) involved in the calculation. The read signals referred to herein as vector signals may be applied as input values (205) to the row lines (201) of the memcapacitive cross-bar array (200). The vector signals may represent a vector to be multiplied to the matrix represented by the program signals. In one example, the vector signals have a relatively lower voltage value than the first voltages used to program the memcapacitors (203) such that the voltage level applied by the vector signals does not change the capacitance values of the memcapacitors (203) as programmed by the first voltages. The vector signals act as read signals in this manner by not changing the capacitance values of the memcapacitors (203).

The vector signals interact with the memcapacitors (203) at their respective junctions (207), and the resulting voltage is collected at the end of each column line (202) at 206. The sum of each column line (202) is represented by $\Sigma v_i c_{i1}$, $\Sigma v_i c_{i2}$, $\Sigma v_i c_{i3}$, and $\Sigma v_i c_{i4}$ as indicated in FIG. 2. The sums obtained from the voltage values represent the values of a column vector. These sums of each column line (202) may also be summed through a charge collection line to obtain a single value of $$\sum_{i=1}^{m} Vout_i$$

depicted in FIG. 3 and as will be described in more detail below. In one example, an initial ground signal may be applied to the memcapacitors (203) before application of the program signals and the vector signals in order to clear all charges from the memcapacitors (203).

Figure 3:
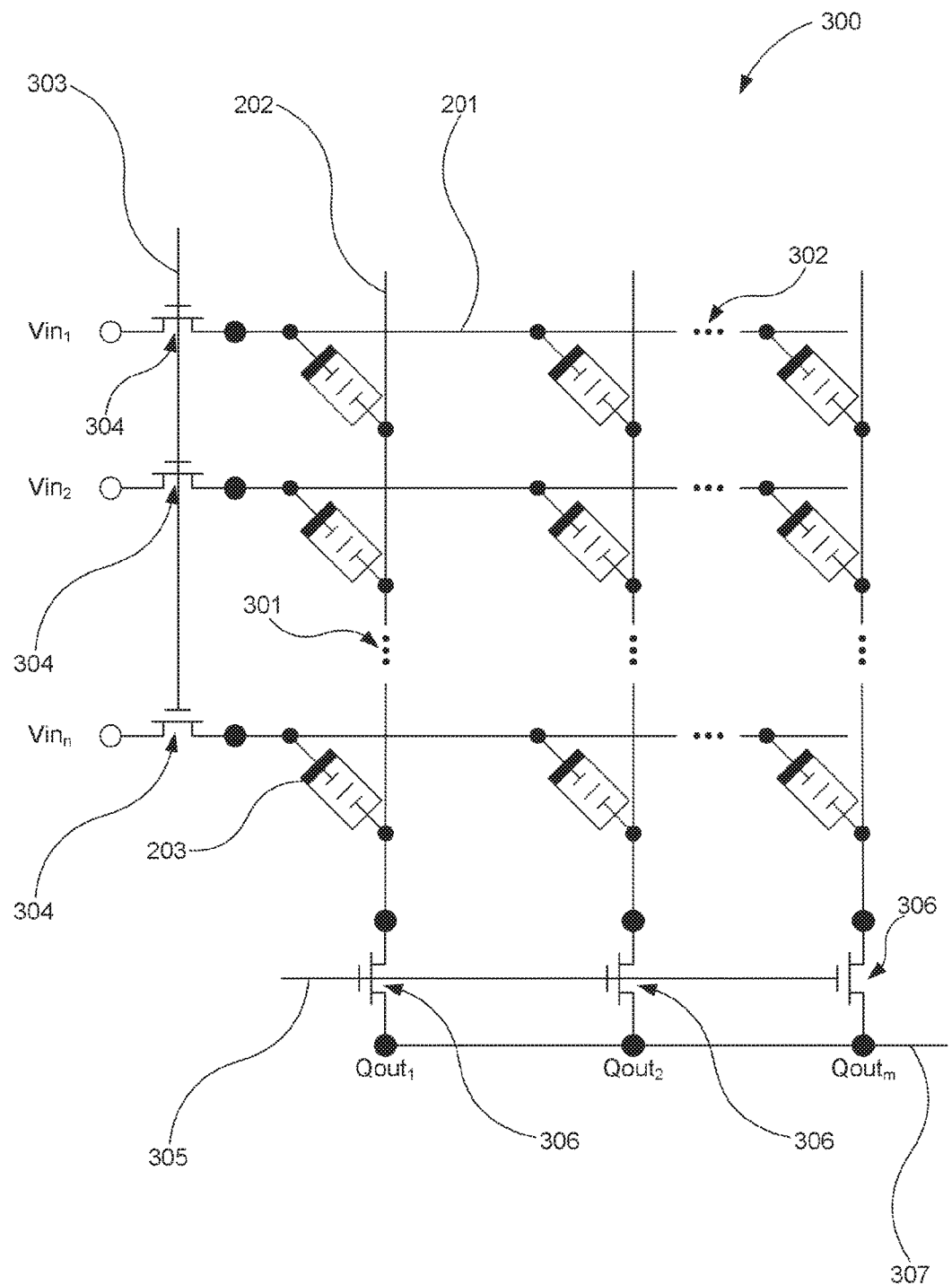
FIG. 3 is a circuit diagram of the DPE memcapacitive array of FIGS. 1 and 2, according to one example of the principles described herein.

FIG. 3 is a circuit diagram (300) of the DPE memcapacitive array of FIGS. 1 and 2, according to one example of the principles described herein. Although the DPE memcapacitive array (110) of FIG. 3 is depicted as having a circuit layout as depicted, any number of circuit layouts may be used to achieve the function of the present systems and methods. The DPE memcapacitive array (110) as depicted in FIG. 3 includes the row lines (201), the column lines (202), and the memcapacitors (203) as described above in connection with FIG. 2. As mentioned above, any number of row lines (201) and column lines (202) may be included within the DPE memcapacitive array (110) as indicated by the ellipses (301, 302).

The DPE memcapacitive array (110) may further include a charge line (303), a number of charge gates (304), an evaluation line (305), and a number of evaluation gates (306). The charge gates (304) and evaluation gates (306) may be included in order to prevent any charge stored within the memcapacitors (203). In one example, the charge gates (304) and evaluation gates (306) are transistors. Memcapacitors (203) function in a similar manner as capacitors in that memcapacitors (203) are used to store energy electrostatically in an electric field. Memcapacitors (203) contain at least two electrical conductors called plates separated by a dielectric (i.e. an insulator). Examples of the conductors may include thin films, foils, or sintered beads of metal or conductive electrolyte, among other forms of conductive materials. The non-conducting, insulating dielectric acts to increase the memcapacitor's (203) charge capacity. Examples of a dielectric include glass, ceramic, plastic film, air, vacuum, paper, mica, or oxide layers, among other types of insulators Unlike a memristor, a memcapacitor (203) ideally does not dissipate energy. Instead, a memcapacitor (203) stores energy in the form of an electrostatic field between its plates. In order to ensure that the memcapacitors (203) in the DPE memcapacitive array (110) do not leak or completely discharge their respective stored charges resulting from input voltages from, for example, a program signal, the charge gates (304) and evaluation gates (306) are coupled to the row lines (201) and column lines (202), respectively.

The opening and closing of the charge gates (304) and the evaluation gates (306) may be performed in connection with a clocked control signal to control the opening and closing of the charge gates (304) and the evaluation gates (306). A signal may be sent down the charge line (303) and evaluation line (305) to open the charge gates (304) and the evaluation gates (306). In one example, a signal may be sent down the charge line (303) to open the charge gates (304) each time a program voltage or a read voltage is applied to the row lines (201). Similarly, a signal may be sent down the evaluation line (305) to open the evaluation gates (306) each time a charge (q) is to be collected to determine the dot product.

As described above, the program signals and the read signals may be input to the row lines (201) of the DPE memcapacitive array (110) as input values as indicated by $Vin_1$, $Vin_2$, and $Vin_n$. Resulting charges (Q) may be obtained from the column lines (202) of the DPE memcapacitive array (110) as output charge values as indicated by $Qout_1$, $Qout_2$, and $Qout_n$. The output charge values ($Qout_1$, $Qout_2$, and $Qout_n$) may also be collected at a collection line (307). The charge collected at the column lines (202) and the collection line (307) may be expressed or converted into different values such as current using the following.

$$I = \frac{dQ}{dt} \qquad \text{Eq. 2}$$

where I is the current, dQ is the change in charge, and dt is the change in time.

Using Equation 2, the resolution of the collected current may be tuned such that monitoring the change in current over a longer period of time will result in a higher resolution, and monitoring the change in current over a shorter period of time will result in a lower resolution. The output current as determined by the output charge values ($Qout_1$, $Qout_2$, and $Qout_n$) is a summation of the voltage times the inductance. Stated differently, the charge within a memcapacitor (203) is equal to the integral of the current as well as proportional to the voltage. A constant of integration is added to represent the initial voltage $V(t_0)$. The integral form of the capacitor equation is as follows:

$$V(t) = \frac{Q(t)}{C} = \frac{1}{C}\int_{t_0}^{t} I(\tau)d\tau + V(t_0) \qquad \text{Eq. 3}$$

Taking the derivative of this and multiplying by C yields the following:

$$I(t) = \frac{dQ(t)}{dt} = C\frac{dV(t)}{dt} \qquad \text{Eq. 4}$$

Use of memcapacitors (203) within the DPE memcapacitive array (110) instead of, for example, memristors, has several advantages. One such advantage is that the memcapacitors (203) may be able to expand the computation from a time domain to a frequency domain. Stated differently, instead of computing with DC signals, the present DPE memcapacitive array (110) computes the dot product using AC signals.

For example, an AC signal may be programmed into different memcapacitors (203). The different capacitance values of the memcapacitors (203) would cause different RC delay. An RC time constant, also referred to herein as tau ($\tau$) and as included in Eq. 3, is the time constant in seconds of an RC circuit, and is equal to the product of the circuit resistance in ohms and the circuit capacitance in farads as presented in the following:

$$\tau = R*C \qquad \text{Eq.5}$$

In the case that the voltage input is $V_0*\cos(w*t)$, the current is:

$$I = C * \frac{dV}{dt} = -w * C * V_0 * \sin(w * t) \qquad \text{Eq. 6}$$

where w=2*pi*f, and f is the frequency Thus, with a sampling circuit working at the same frequency f with a phase delay pi/2, sin(w*t) always is equal to 1. With this understanding, Eq. 6 may be directly equivalent to:

$$I = w * C * V_0 \qquad \text{Eq. 7}$$

Thus, additional frequency domain computations may be carried out by injecting different AC signals to the memcapacitors (203) within the DPE memcapacitive array (110).

Use of AC signals may also be more advantageous than use of voltages is that computing with DC signals on a memcapacitor array creates a situation where sneak current issues arise. Once a DC signal is removed from the DPE memcapacitive array (110), there will be current flowing among unsaturated memcapacitors (203) since the unsaturated memcapacitors (203) are charged to different voltages. Even if the memcapacitors (203) are all saturated, once the memcapacitors (203) are freely discharging in the DC signal example, the memcapacitors (203) are doing so at different speeds due to the different charges (C) that the memcapacitors (203) have. In this situation, the sneak current again occurs within the DPE memcapacitive array (110) under the application of a DC signal. However, by using AC signals the devices may always be held to eliminate the sneak current issue, and the output may be sampled at the right frequency to get the dot product computation result. Thus, the application of an AC signal is more effective and more efficient than the application of a DC signal.

Figure 4:
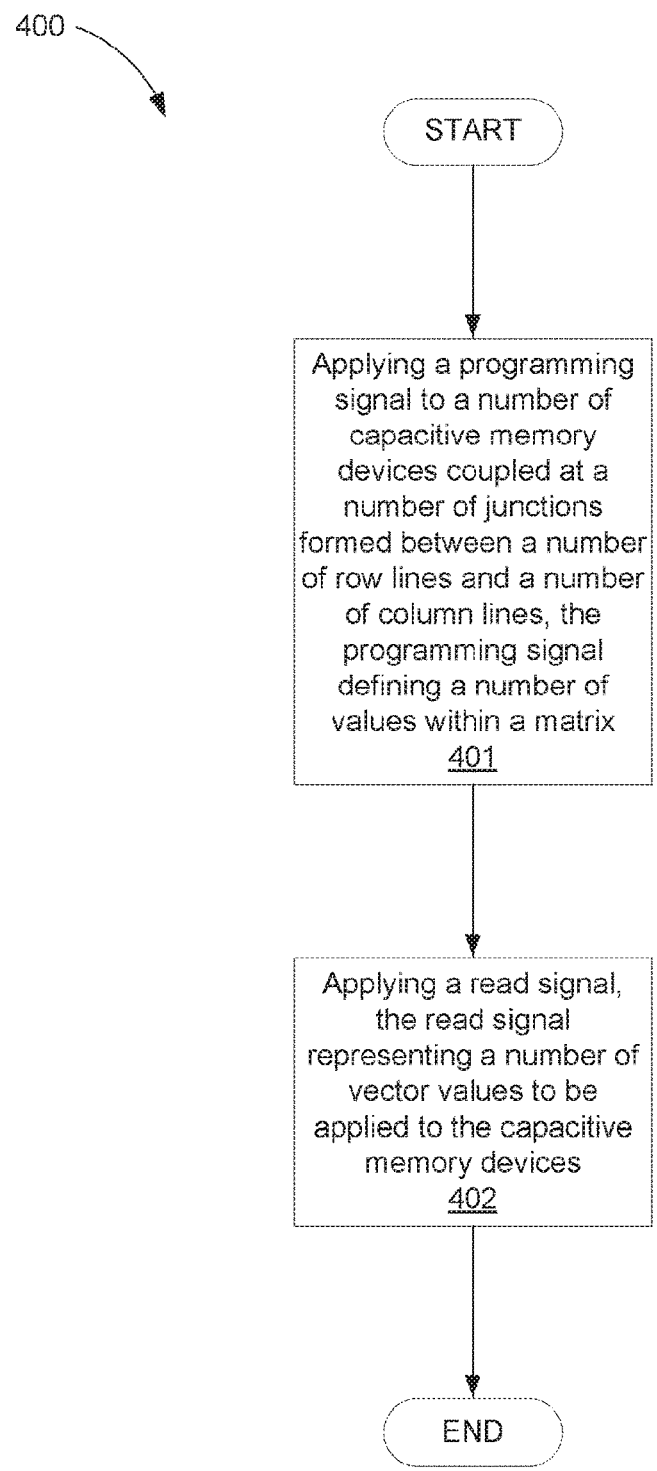
FIG. 4 is a flowchart showing a method of operation of the DPE memcapacitive array of FIGS. 1 and 3, according to one example of the principles described herein.

FIG. 4 is a flowchart showing a method (400) of operation of the DPE memcapacitive array of FIGS. 1 and 3, according to one example of the principles described herein. The method of FIG. 4 may begin by applying (block 401) a programming signal to a number of capacitive memory devices (203) coupled at a number of junctions (207) formed between a number of row lines (201) and a number of column lines (202). As described above, the program signal defines a number of values within a mathematical matrix. The programming signal may include a number of input voltage values that are addressed to the memcapacitors (203) to map the mathematical matrix to the DPE memcapacitive array (110).

In applying (block 401) the programming signal, the computing system (100) may apply an electrical signal to the charge line (303). Application of an electrical signal to the charge line (303) opens the charge gates (304) in order to allow the program voltage to be applied to the row lines (201).

The method (400) may continue by applying (block 402) a read signal. The read signal represents a number of vector values to be applied to the capacitive memory devices (203) of the DPE memcapacitive array (110). The read signals are applied to the row lines (201) of the DPE memcapacitive array (110). As described above, the vector signals represent a vector to be multiplied to the matrix represented by the program signals applied at block 401. In this manner, the mathematical matrix mapped to the DPE memcapacitive array (110) is multiplied through application of the vector signals.

As described above, the currents may be collected from the memristors (203) via the column lines (202) and collection line (307) to obtain a final current that represents the dot product of the matrix values and vector values. In order to collect the current, the computing system (100) may apply an electrical signal to the evaluation line (305). Application of an electrical signal to the evaluation line (305) opens the evaluation gates (306) in order to allow the current to be collected from the memristors (203) via the column lines (202).

In order to represent a new mathematical matrix and vector, the process of FIG. 4 may loop back to block 401 in which a number of new first voltages are applied (block 401) to a corresponding number of row lines (201) within the DPE memcapacitive array (110) to change the capacitance values of a corresponding number of memcapacitors (203). In this manner, new capacitive values are programmed into the memcapacitors (203) of the DPE memcapacitive array (110) that represent the new mathematical matrix. The method may continue to block 402 as described above by applying (402) new second voltages to a corresponding number of row lines (201) within the DPE memcapacitive array (110) that represent a corresponding number of new vector values to be applied to the matrix values programmed into the memcapacitors (203).

In one example, a number of ground signals are applied before programming the memcapacitors (203) with the program signals at block 401 and between iterations of dot product calculations. The ground signals clear all charges from the capacitive memory devices. In this manner, the process of FIG. 4 may be referred to as a charge mode DPE operation.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (101) of the computing system (100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe methods and a memcapacitive cross-bar array for determining a dot product. The memcapacitive cross-bar array includes a number of row lines, a number of column lines intersecting the row lines to form a number of junctions, and a number of capacitive memory devices coupled between the row lines and the column lines at the junctions. The capacitive memory devices receive a number of programming signals. The programming signals define a number of values within a matrix. The capacitive memory devices also receive a number of vector signals. The vector signals define a number of vector values to be applied to the capacitive memory devices. The memcapacitive cross-bar array also includes a charge collection line to collect all charges output from the capacitive memory devices through their respective column lines. The collected charge equals a dot product of the matrix values and vector values.

This memcapacitive cross-bar array for determining a dot product may have a number of advantages, including: (1) elimination of sneak path leakage due to the use of memcapacitors versus memristors; (2) charge sharing is worked in a step function which makes moot challenges associated with linearity in a memristor system; (3) power consumption is low due to a lack of static current within the memcapacitive cross-bar array; (4) the output measurement resolution is tunable through different integration periods; (5) reduced cost in manufacturing as compared to a memristor system that may require additional circuit elements to address sneak path leakage, among other advantages; and (6) with the use of memcapacitors, the region of computation is expanded from a time domain to a frequency domain resulting in the memcapacitors use of different AC signals as the computing signals, with different sampling systems.

The preceding description has been presented to illustrate and describe examples of the principles described. This description is not intended to be exhaustive or to limit these principles to any precise form disclosed. Many modifications and variations are possible in light of the above teaching.

What is claimed is:

1. A memcapacitive cross-bar array for determining a dot product, comprising:
    a number of row lines;
    a number of column lines intersecting the row lines to form a number of junctions;
    a number of capacitive memory devices coupled between the row lines and the column lines at the junctions, the capacitive memory devices to:
        receive a number of programming signals, the programming signals defining a number of values within a matrix, and
        receive a number of vector signals as voltages inputted into the row lines, the vector signals defining a number of vector values to be applied to the capacitive memory devices; and
    a charge collection line to collect charges as an output from the respective column lines of the capacitive memory devices, the collected charges equaling a dot product of the matrix values and vector values, wherein the collected charges are returned from the voltages inputted into the row lines.

2. The memcapacitive cross-bar array of claim 1, in which the capacitive memory devices further receive a number of ground signals, the ground signals clearing all charges from the capacitive memory devices.

3. The memcapacitive cross-bar array of claim 1, further comprising:
    a number of row gates coupled to the row lines; and
    a charge line to open the row gates upon application of a current through the charge line.

4. The memcapacitive cross-bar array of claim 3, in which the charge line serves as a clock control signal.

5. The memcapacitive cross-bar array of claim 1, further comprising:
    a number of column gates coupled to the column lines between the capacitive memory devices and the charge collection line; and
    an evaluation line to open the column gates upon application of a current through the evaluation line.

6. The memcapacitive cross-bar array of claim 5, in which the evaluation line serves as a clock control signal.

7. The memcapacitive cross-bar array of claim 1, in which the memcapacitive cross-bar array is used as an accelerator in connection with a secondary computer program such that the output of the memcapacitive cross-bar array is coupled to a processing device as input for the secondary computer program.

8. A method of obtaining a dot product comprising:
    applying a programming signal to a number of capacitive memory devices coupled at a number of junctions formed between a number of row lines and a number of column lines, the programming signal defining a number of values within a matrix,
    applying a vector signal as voltages inputted into the row lines, the vector signal defining a number of vector values to be applied to the capacitive memory devices; and
    collecting charges as an output from the capacitive memory devices, the collected charges equaling a dot product of the matrix values and vector values, wherein the collected charges are returned from the voltages inputted into the row lines.

9. The method of claim 8, further comprising applying a number of ground signals, the ground signals clearing all charges from the capacitive memory devices.

10. The method of claim 8, in which applying the programming signal to the capacitive memory devices comprises opening a number of charge gates coupled to the row lines to charge the capacitive memory devices.

11. The method of claim 10, further comprising:
    closing the charge gates; and
    opening a number of evaluation gates coupled to the column lines.

12. The method of claim 11, in which opening the evaluation gates comprises using the evaluation gates as a clock control signal.

13. A computing device for determining a dot product, comprising:
    a processor;
    a memcapacitive cross-bar array; and
    a capacitive memory device of a plurality of memory devices comprising executable code to, when executed by the processor:
        input a number of programming signals defining a number of values within a matrix;
        input a number of vector signals values as voltages inputted into the row lines for defining a number of vector values to be applied on the capacitive memory device;
        collect charges as an output from the capacitive memory devices, the collected charges equaling a dot product of the matrix values and vector values; and
        return the collected charges are returned from the voltages inputted into the row lines.

14. The computing device of claim 13, in which inputting a number of programming signals defining a number of values within a matrix comprises applying the programming signals to a number of capacitive memory devices, of the plurality of memory devices, coupled at a number of junctions formed between a number of row lines and a number of column lines, each programming signal applied to a respective capacitive memory device defining an entry within the matrix.

15. The computing device of claim 13, in which inputting a number of vector signals defining a number of vector values comprises applying the vector signals to a number of capacitive memory devices, of the plurality of memory devices, coupled at a number of junctions formed between a number of row lines and a number of column lines, each vector signal applied to a respective capacitive memory device, of the plurality of memory devices, defining a vector value.

\* \* \* \* \*